(12) United States Patent
Pantke

(10) Patent No.: US 8,384,501 B2
(45) Date of Patent: Feb. 26, 2013

(54) ELECTROMAGNETIC ACTUATOR HAVING A MAGNETOSTRICTIVE ELEMENT AND METHOD FOR OPERATING THE ELECTROMAGNETIC ACTUATOR

(75) Inventor: Michael Pantke, Friedrichshafen (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 47 days.

(21) Appl. No.: 12/940,365

(22) Filed: Nov. 5, 2010

(65) Prior Publication Data

US 2011/0148553 A1   Jun. 23, 2011

(30) Foreign Application Priority Data

Dec. 18, 2009   (DE) .................. 10 2009 054 952

(51) Int. Cl.
*H01H 55/00* (2006.01)
*H01F 7/04* (2006.01)
*H01F 7/08* (2006.01)

(52) U.S. Cl. .............. 335/3; 335/215; 335/220; 310/26; 251/192.06

(58) Field of Classification Search .................. 335/2, 3, 335/209, 215, 220–229; 251/192.06; 310/26
See application file for complete search history.

(56) References Cited

U.S. PATENT DOCUMENTS

| 3,942,759 | A | 3/1976 | Passera et al. |
| 6,433,991 | B1* | 8/2002 | Deaton et al. ................. 361/191 |
| 6,558,127 | B2* | 5/2003 | Maruyama et al. .......... 417/44.1 |
| 7,307,371 | B2* | 12/2007 | Jensen et al. ................. 310/328 |
| 7,323,960 | B2 | 1/2008 | Maruyama |

FOREIGN PATENT DOCUMENTS

| DE | 2 246 574 | 3/1974 |
| DE | 36 33 312 A1 | 4/1988 |

* cited by examiner

*Primary Examiner* — Bernard Rojas
(74) *Attorney, Agent, or Firm* — Davis & Bujold, PLLC

(57) ABSTRACT

An electromagnetic actuator (1) with an armature (3) mounted so that the armature can be moved by virtue of a bearing arrangement (6A, 6B) and an electric coil (4) is provided for moving the armature (3). A magnetostrictive element (8) is provided, by which relative movement between the armature (3) and at least part of the bearing arrangement (6A, 6B) is produced.

17 Claims, 2 Drawing Sheets

ELECTROMAGNETIC ACTUATOR HAVING A MAGNETOSTRICTIVE ELEMENT AND METHOD FOR OPERATING THE ELECTROMAGNETIC ACTUATOR

This application claims priority from German patent application serial no. 10 2009 054 952.8 filed Dec. 18, 2009.

FIELD OF THE INVENTION

The invention relates to an electromagnetic actuator having an armature mounted to move by virtue of a bearing device and with a coil for moving the armature, and to a method for actuating the electromagnetic actuator.

BACKGROUND OF THE INVENTION

Such actuators are very commonly used for producing control movements, for example in valve devices of vehicles or in closing mechanisms of vehicle windows or doors. Depending on its intended purpose the armature can be moved by the coil either in rotation or in translation. To do this the coil is energized with a signal so that it produces a magnetic field, which in turn drives the armature that generates the control movement. The bearing device is designed in accordance with the desired movement direction of the armature and can therefore comprise rotary bearings when the armature is to be rotated by the coil or translation bearings when the armature is to be moved in translation by the coil.

When the coil is energized, as a result of friction the movement sequence of the armature may be irregular and this can cause undesired noise or hysteresis effects. During this the armature alternately sticks, when static friction becomes predominant, and breaks free, whereupon sliding friction predominates. This is also known as the slip-stick effect. In particular, the associated hysteresis effects make it more difficult to control the actuator.

To prevent sticking effects in a valve actuated by an actuator, DE 36 33 312 C1 proposes that in the end positions of the valve a pulsating signal should be fed to a coil of the actuator. In DE 22 46 574, to produce low hysteresis in a valve actuated by an actuator, it is proposed to superimpose a dither- or chopper-signal on a direct-voltage control signal of a coil of the actuator. In both cases the result is that an armature of the actuator is moved continuously relative to the bearing device of the armature, so that sliding friction is predominant and only slight sticking or hysteresis effects, or none at all, can occur.

In practice, however, hysteresis effects that impair the controllability of the actuator still occur. These can be attenuated by increasing the speed of the armature's movement by increasing the frequency of the pulsating signal or the dither- or chopper-signal. However, this is only possible within certain limits since with increasing frequency the speed of the armature decreases again because of its inertia, and consequently, above a limit frequency the advantageous continuous armature movement ceases.

SUMMARY OF THE INVENTION

The purpose of the present invention is to provide an electromagnetic actuator and a method for operating it, by virtue of which very low hysteresis effects can be achieved.

This objective is achieved by providing a magnetostrictive element by which relative movement between the armature and at least part of the bearing device can be produced.

A magnetostrictive element changes its external shape as a function of a magnetic field surrounding the element. As a result it is no longer necessary to keep the entire armature moving continuously relative to the bearing device in order to prevent the slip-stick effect, but rather, by means of the magnetostrictive element, controlled relative movements between parts of the bearing arrangement and the armature can be produced. That is to say, there is no need to keep the entire armature moving continuously, but only parts of the bearing device or of the armature, whereby the frequency for producing this relative movement can advantageously be increased further compared with the prior art. A further advantage is that due to its deformation the magnetostrictive element produces mechanical vibrations when the field strength or field orientation of the magnetic field surrounding the magnetostrictive element is correspondingly varied. These mechanical vibrations generate large mechanical forces and can be transmitted directly to parts of the bearing arrangement or the armature, whereby the inertia of these parts can be overcome easily even at very high vibration frequencies. The effect according to the invention is particularly pronounced if a highly magnetostrictive element is used. A suitable highly magnetostrictive material for the element is, for example, a Fe—Co alloy, in particular a $Fe_{50}Co_{50}$ alloy. The magnetostrictive element can also consist of a plurality of layers of different materials having different magnetostrictive properties.

In a preferred further development of the invention, the magnetostrictive element is positioned in the area of a magnetic field produced by the coil, whereby the coil can be used both to produce the actual control movement of the armature and also to produce the relative movement between the armature and the at least one part of the bearing device by the deformation of the magnetostrictive element. The actuator can therefore be made very compactly and inexpensively, since no additional coils are needed for exciting the magnetostrictive element. In this case the signal for energizing the coil preferably has superimposed on it an oscillating signal, for example a dither- or chopper-signal, which excites the magnetostrictive element into mechanical vibrations. Of course, more than one coil can be provided in the actuator, and then at least one of the coils is arranged in the area of the armature and is energized with a control signal for producing the control movement of the armature, while at least another of the coils is arranged in the area of the magnetostrictive element and is energized with the oscillating signal in order to excite the magnetostrictive element.

In one design of the invention a housing made in at least two portions is provided, with a first bearing of the bearing arrangement located in a first housing portion and a second bearing of the bearing arrangement in a second housing portion. In this case the magnetostrictive element is positioned between the first and second housing portions, whereby a magnetic-field-induced shape change of the magnetostrictive element produces relative movement between these housing portions and the bearings of the bearing arrangement located in or on them, which at the same time results in relative movement between at least one of the bearings and the armature.

In another design of the invention the armature is made in at least two portions, and the magnetostrictive element is arranged between these two armature parts and can therefore produce a relative movement between them. In this case the first armature portion is held by a first bearing of the bearing arrangement and the second armature portion by a second bearing of the bearing arrangement, so that the relative movement between the portions of the armature also produces relative movement between at least one of the bearings and one of the armature portions.

In a further design of the invention the magnetostrictive element is arranged in or on one bearing of the bearing arrangement, whereby the relative movement between the bearing arrangement and the armature can be produced directly in or on the bearing of the bearing arrangement by movement thereof relative to the armature. In such a case the above-described two-part construction of a housing of the armature, or of the armature, is not necessary.

To enable simple relative movement between the armature and the bearing arrangement in the embodiments of the invention, the bearing arrangement preferably consists of slide bearings for guiding the armature. Basically, however, roller bearings can also be used for guiding the armature, but then the bearing concerned must enable the desired relative movement between the bearing and the armature, for example by virtue of bearing play in the longitudinal direction of the armature or by using cylindrical roller or needle bearings.

To move the armature, it can also have at least one permanent magnet which in a known way enables the actuator to effect its control movement when the coil is energized, or instead of this, at least one second coil fixed on the armature can be provided, which is energized together with the main coil in order to produce the control movement of the armature. To produce a rotary control movement the armature can also be designed as a rotor with further coils, permanent magnets or a cage which, together with further coils in fixed arrangement relative to the armature to act as a stator, bring about rotational movement of the armature.

Preferably, the actuator according to the invention is used in motor vehicles where, with little structural space available, as accurate a control movement as possible has to be carried out. For example, such an actuator is suitable for use in a pneumatic or hydraulic valve of a utility or passenger vehicle, where on the one hand very little space is available and on the other hand great positional accuracy is demanded from such an actuator.

The declared objective of the invention is also achieved by a method for operating the electromagnetic actuator according to the invention. In this, a coil of the electromagnetic actuator is energized with a signal and, as a function of the signal, a magnetic field is produced. During this, by virtue of the magnetic field a magnetostrictive element of the electromagnetic actuator is deformed, and this deformation brings about relative movement of an armature of the actuator mounted so that it can move by virtue of a bearing arrangement, relative to at least one part of the bearing arrangement.

The signal preferably consists of a control signal for producing a control movement of the armature and an oscillating signal superimposed on the control signal for deforming the magnetostrictive element, the oscillating signal being in particular a chopper- or dither-signal. In this way the coil produces a fluctuating magnetic field, which on the one hand moves the armature to perform control tasks, and on the other hand also brings about a fluctuating deformation of the magnetostrictive element and hence an advantageous, continuous relative movement of the armature relative to its bearing arrangement.

Preferably, the frequency of the oscillating signal is high enough that by virtue of the oscillating signal, owing to its inertia and without excitation of the magnetostrictive element, the armature cannot move. This means that the frequency of the oscillating signal is preferably high enough that the armature of an actuator without a magnetostrictive element could not be moved by the oscillating signal alone, but would remain static owing to its inertia. Thanks to such high frequencies particularly small hysteresis effects are obtained, which could not be achieved without the magnetostrictive element. Thus, the magnetostrictive element used according to the invention eliminates the limits imposed in the prior art by the inertia of the armature.

BRIEF DESCRIPTION OF THE DRAWINGS

Below, the invention is explained in more detail with reference to examples and drawings from which further advantageous design features can be seen. The figures are schematic representations showing.

DETAILED DESCRIPTION OF THE PREFERRED EMBODIMENTS

Figure 1:
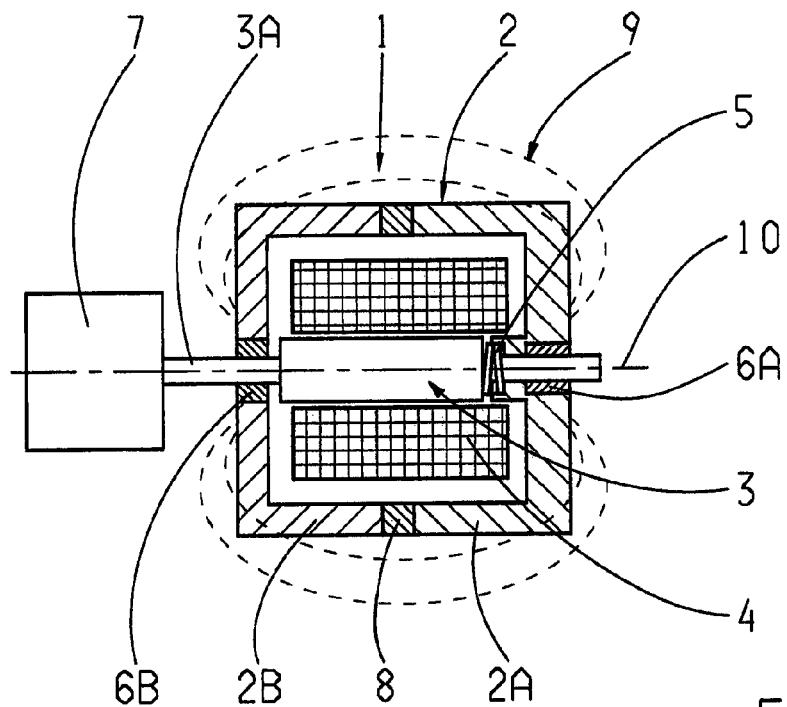
FIG. 1: Actuator with a housing divided into two parts and a magnetostrictive element arranged between the parts of the housing

The actuator 1 shown in FIG. 1 has a housing 2 inside which are arranged an armature 3, a bearing arrangement 6A, 6B, at least one coil 4 and an elastic spring 5. In this case the bearing arrangement consists of two bearings 6A, 6B in the form of slide bearings, which guide an armature rod 3A of the armature that projects out of the housing 2. The armature rod 3A serves to actuate a device 7, for example a pneumatic or hydraulic pressure control valve of a vehicle transmission.

The housing 2 is divided in two portions, the first housing portion 2A firmly holding the first bearing 6A of the bearing arrangement and the second housing portion 2B firmly holding the second bearing 6B. Between the two housing portions 2A, 2B is arranged a magnetostrictive element 8 which connects the two housing portions 2A, 2B.

When the coil 4 is energized with a signal, then depending on the design of the coil 4 and the armature 3, the armature 3 can be moved either in rotation or in translation, so that by virtue of the end of the armature rod 3A projecting out of the housing 2 a corresponding rotational or translational control movement can be produced. The spring 5 serves to move the armature 3 back to its initial position once the coil 4 is no longer energized, and in particular it can therefore be made as a spiral spring if the armature 3 is of the rotary-moving type or as a helical spring if the armature 3 moves in translation. When the coil 4 is energized with the signal, then depending on the signal, a magnetic field 9—indicated by broken lines— forms around the coil 4, in the area of which the magnetostrictive element 8 and the armature 3 are arranged. The magnetic field 9 now brings about both the control movement of the armature 3 and a change of the shape of the magnetostrictive element 8. The direction and magnitude of the shape change depend in particular on the field strength and orientation of the magnetic field 9, or the coil that produces the magnetic field 9, and on the material of the magnetostrictive element 8. In the case illustrated, the magnetic field 9 is so orientated and the material of the magnetostrictive element 8 so chosen that under the action of the magnetic field 9 the magnetostrictive element 8 extends or contracts in the longitudinal direction 10 of the armature 3, whereby the magnetostrictive element 8 directly changes the distance between the housing portions 2A, 2B and the bearings 6A, 6B so that a relative movement takes place between at least one of the bearings 6A, 6B and the armature 3 in the longitudinal direction 10 of the armature.

The signal for energizing the coil 4 in this case consists of a control signal for producing the control movement of the armature 3 and a superimposed oscillating signal for producing the relative movement between the bearings 6A, 6B and the armature 3 by virtue of the deformation of the magnetostrictive element 8. The deformation of the magnetostrictive element 8 excited by the oscillating signal varies at the same or a similar frequency as the oscillating signal, so very rapid relative movement between the bearings 6A, 6B and the armature can be produced, thereby greatly reducing any hysteresis effects.

Figure 2:
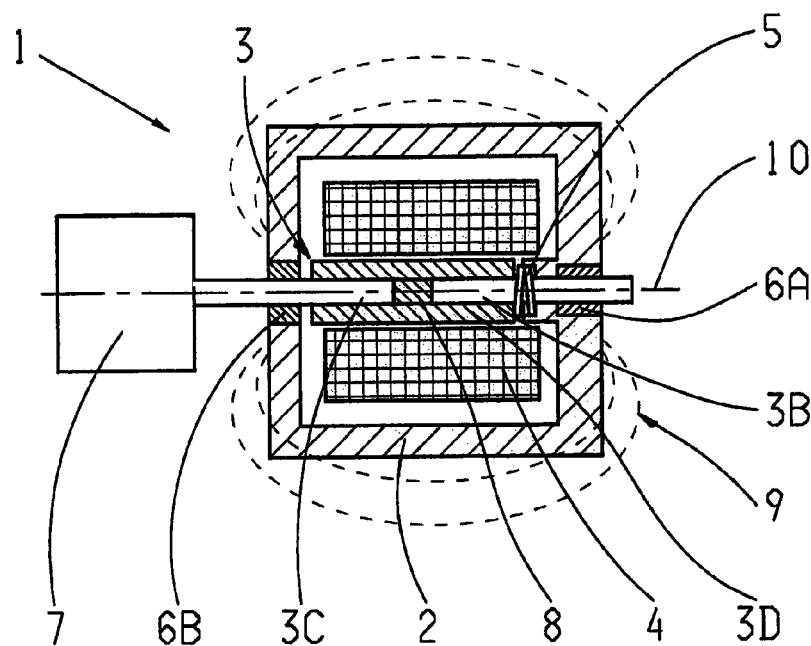
FIG. 2: Actuator with a two-part armature and a magnetostrictive element arranged between the parts of the armature

The actuator 1 shown in FIG. 2 comprises essentially the same components as the actuator 1 shown in FIG. 1. Accordingly, equivalent components with the same functions are given the same indexes in FIGS. 1 and 2. However, compared with the actuator 1 in FIG. 1 the housing 2 of the actuator 1 in FIG. 2 is a one-piece structure whereas the armature 3 has more than one part.

In the design of the invention according to FIG. 2 the armature 3 consists of an armature rod divided into two parts 3B, 3C and a hollow shaft 3D that supports the armature rod 3B, 3C whose inside, besides the magnetostrictive element 8, also accommodates the ends of the armature rod portions 3B, 3C that are in contact with the magnetostrictive element 8. The first armature rod portion 3B is mounted in the housing 2 in the first bearing 6A and the second armature rod portion 3C is mounted in the housing in the second bearing 6B. At least one of the armature rod portions 3B, 3C can move in the longitudinal direction 10 of the armature relative to the shaft 3D. Thus, when the coil 4 is energized, by virtue of a deformation of the magnetostrictive element 8 due to the magnetic field 9 produced, the armature rod portion 3B, 3C concerned can move in the longitudinal direction 10 of the armature, each relative to the other of the armature rod portions 3B, 3C, whereby the advantageous relative movement between the armature 3, or the armature rod portion 3B, 3C, and one of the bearings 6A, 6B of the bearing arrangement takes place. In this case the ends of the magnetostrictive element 8 facing toward the armature rod portions 3B, 3C are connected fixed to the respective ends of the armature rod portions 3B, 3C, for example adhesively bonded thereto.

Figure 3:
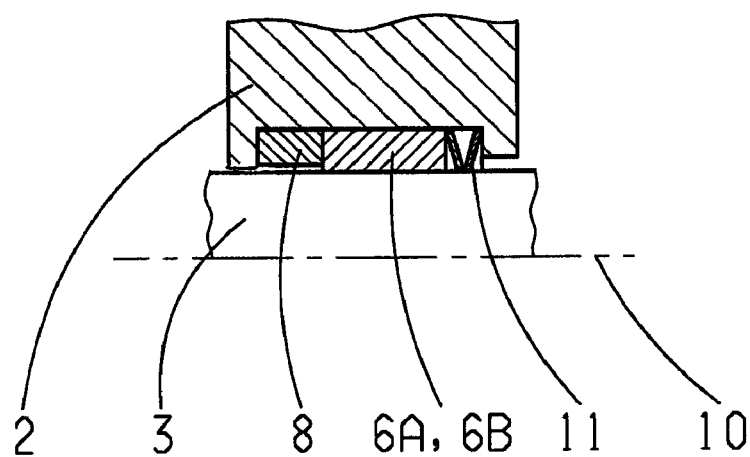
FIG. 3: Section of an actuator with a magnetostrictive element, the magnetostrictive element being arranged between a housing and a bearing of the actuator

Alternatively or in addition to the arrangement of the magnetostrictive element 8 between two housing portions 2A, 2B or two armature portions 3B, 3C, a magnetostrictive element 8 can also be arranged directly in or on one of the bearings 6A, 6B of the bearing arrangement, in such manner that a deformation of the element 8 leads directly to a displacement of the bearing 6A, 6B or parts thereof relative to the armature 3. For example, as shown in FIG. 3 one or more bearings 6A, 6B of the bearing arrangement can be arranged so that it/they can to move in each case between an elastic spring 11 and a magnetostrictive element 8 in the housing 2, so that a deformation of the magnetostrictive element 8 produces a relative movement of the bearing 6A, 6B concerned relative to the armature 3 in the longitudinal direction 10 of the latter. In FIG. 3 the bearing 6A, 6B is a slide bearing in which the armature 3 can move in translation or in rotation.

Figure 4:
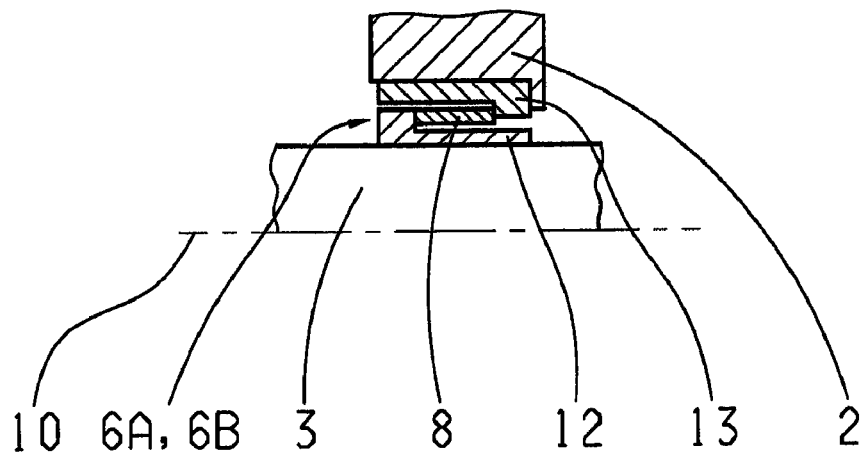
FIG. 4: Section of an actuator with a magnetostrictive element, the magnetostrictive element being arranged between an inner bearing ring and an outer bearing ring of a bearing of the actuator.

Likewise, as shown in FIG. 4, one or more bearings 6A, 6B of the bearing arrangement can consist of an inner bearing ring 12 arranged to move on the armature 3 and an outer bearing ring 13 connected fixed on the housing 2, while the magnetostrictive element 8 is arranged between the inner and outer bearing rings 12, 13 in such manner that a deformation of the magnetostrictive element 8 brings about an advantageous relative movement between the inner bearing ring and the armature 3 in the longitudinal direction 10 of the latter. For this, the end faces of the magnetostrictive element 8 are connected fixed, for example bonded, to the outer and inner bearing rings 12, 13. In FIG. 4 the armature 3 can move in translation or rotation by sliding in the inner bearing ring 12.

Otherwise than in FIGS. 1 and 2 the bearing arrangement can also be located spatially separated or at a distance away from the coil 4, for example, particularly when the actuator 1 according to the invention is used for actuating a hydraulic or pneumatic valve device, it can be located spatially inside the valve device.

To save weight and cool the coil 4, the housing 2 of the actuator 1 in FIG. 1, 2, 3 or 4 can alternatively also be made in the form of a frame which holds the bearings 6A, 6B, the armature 3, the coil 4 and the spring 5 in a defined manner relative to one another. The housing 2 can also have openings to enable the entry of a coolant liquid, or it can likewise be well sealed hermetically with seals to prevent the penetration of a surrounding fluid. To simplify assembly of the actuator, the housing 2, the armature 3 or the magnetostrictive element 8 can also consist of a plurality of components which are joined firmly together during assembly.

INDEXES

1 Actuator
2 Housing
2A Housing portion
2B Housing portion
3 Armature
3A Armature rod
3B Armature rod portion
3C Armature rod portion
3D Shaft
4 Coil
5 Spring
6A Bearing
6B Bearing
7 Device
8 Magnetostrictive element
9 Magnetic field
10 Longitudinal direction of the armature
11 Spring
12 Inner bearing ring
13 Outer bearing ring

The invention claimed is:

1. An electromagnetic actuator (1) comprising:
   an armature (3) mounted by a bearing arrangement (6A, 6B) so as to be one of rotationally and translationally movable relative to the bearing arrangement (6A, 6B); and
   an electric coil (4) for moving the armature (3);
   wherein a magnetostrictive element (8) is provided for generating, when the magnetostrictive element (8) is energized, relative movement between the armature (3) and at least part of the bearing arrangement (6A, 6B), and
   only a single electric coil (4) is provided, and the single electric coil (4) facilitates both movement of the armature (3) and deformation of the magnetostrictive element (8), and the deformation of the magnetostrictive element (8) is smaller than the movement of the armature (3).

2. The electromagnetic actuator (1) according to claim 1, wherein the magnetostrictive element (8) is positioned in an area of a magnetic field (9) produced by the coil (4).

3. The electromagnetic actuator (1) according to claim 1, wherein the electromagnetic actuator (1) further comprises a housing (2) which comprises first and second housing portions (2A, 2B), and a first bearing (6A) of the bearing arrangement is located within the first housing portion (2A) while a second bearing (6B) of the bearing arrangement is located within the second housing portion (2B), and the magnetostrictive element (8) is arranged between the first and the second housing portions (2A, 2B).

4. The electromagnetic actuator (1) according to claim 1, wherein the armature (3) has at least first and second armature portions (3B, 3C) the magnetostrictive element (8) is arranged between the first and the second armature portions (3B, 3C), and the first armature portion (3B) is mounted in a first bearing (6A) of the bearing arrangement and the second armature portion (3C) is mounted in a second bearing (6B) of the bearing arrangement.

5. The electromagnetic actuator (1) according to claim 1, wherein the electromagnetic actuator (1) actuates one of a hydraulic and a pneumatic valve of a transmission of a vehicle.

6. The electromagnetic actuator (1) according to claim 5, wherein the vehicle is one of a utility vehicle and a passenger vehicle.

7. The electromagnetic actuator (1) according to claim 1, wherein the bearing arrangement (6A, 6B) permits both rotational and translational movement of the armature (3).

8. The electromagnetic actuator (1) according to claim 1, wherein the magnetostrictive element (8) comprises a Fe—Co alloy.

9. The electromagnetic actuator (1) according to claim 1, wherein the magnetostrictive element (8) comprises a $Fe_{50}Co_{50}$ alloy.

10. The electromagnetic actuator (1) according to claim 1, wherein the magnetostrictive element (8) comprises a plurality of layers of different materials which have different magnetorestrictive properties.

11. The electromagnetic actuator (1) according to claim 1, wherein the bearing arrangement (6A, 6B) comprises first and second bearings (6A, 6B) which are axially spaced apart from one another, each of the first and the second bearing (6A, 6B) are supported by opposed sides of a housing, and the magnetostrictive element (8) produces axial movement between the at least two bearings (6A, 6B).

12. The electromagnetic actuator (1) according to claim 1, wherein the magnetostrictive element (8) is rotationally and axially fixedly connected to the armature (3).

13. The electromagnetic actuator (1) according to claim 1, wherein the electromagnetic actuator (1) is accommodated within a housing (2) and the bearing arrangement (6A, 6B) comprises first and second bearings (6A, 6B) which are axially spaced apart from one another and supported by opposed sides of the housing (2),
one end of the armature (3) is connected for actuation of a device (7) while an opposite end of the armature (3) protrudes out of the housing (2), and
a spring biases the armature (3) toward an initial position.

14. A method for actuating an electromagnetic actuator (1) with an armature (3) mounted so that the armature is movable by virtue of a bearing arrangement (6A, 6B) and with an electric coil (4) for moving the armature (3),
wherein a magnetostrictive element (8) is provided, by which relative movement between the armature (3) and at least part of the bearing arrangement (6A, 6B) is produced, the method comprising the steps of:
energizing the coil (4) of the actuator (1) with a signal,
producing a magnetic field (9) as a function of the signal,
deforming the magnetostrictive element (8) by virtue of the produced magnetic field (9) so as to cause relative movement of an armature (3) of the actuator (1), mounted to be able to move by virtue of a bearing arrangement (6A, 6B), relative to at least part of the bearing arrangement (6A, 6B), and
using a first frequency of the electric coil (4) to facilitate movement of the armature (3) and using a second frequency of the electric coil (4) to facilitate deformation of the magnetorestrictive element (8).

15. The method according to claim 14, further comprising the step of defining the signal as a control signal at the first frequency for producing a control movement of the armature (3) and an oscillating signal superimposed on the control signal at the second frequency for deforming the magnetostrictive element (8).

16. The method according to claim 15, further comprising the step of defining the first frequency of the oscillating signal sufficiently high such that, without exciting the magnetostrictive element (8), the armature (3) cannot be moved due to its inertia by the oscillating signal alone.

17. An electromagnetic actuator (1) comprising:
an armature (3) mounted by a bearing arrangement (6A, 6B) so as to be one of rotationally and translationally movable relative to the bearing arrangement (6A, 6B); and
an electric coil (4) for moving the armature (3);
wherein a magnetostrictive element (8) is provided for generating, when the magnetostrictive element (8) is energized, relative movement between the armature (3) and at least part of the bearing arrangement (6A, 6B); and
deformation of the magnetostrictive element (8) directly axially moves at least a portion of the bearing arrangement (6A, 6B) relative to a housing accommodating the electromagnetic actuator (1).

\* \* \* \* \*